United States Patent [19]
Golecki

[11] Patent Number: 4,588,447
[45] Date of Patent: May 13, 1986

[54] METHOD OF ELIMINATING P-TYPE ELECTRICAL ACTIVITY AND INCREASING CHANNEL MOBILITY OF SI-IMPLANTED AND RECRYSTALLIZED SOS FILMS

[75] Inventor: Ilan Golecki, Fullerton, Calif.

[73] Assignee: Rockwell International Corporation, El Segundo, Calif.

[21] Appl. No.: 624,076

[22] Filed: Jun. 25, 1984

[51] Int. Cl.⁴ .................. H01L 21/225; H01L 21/263
[52] U.S. Cl. .................................. 148/1.5; 29/576 B; 148/175; 148/187; 148/DIG. 61; 148/DIG. 77; 156/624
[58] Field of Search ............... 148/1.5, 187, 175; 29/576 B; 156/624

[56] References Cited

U.S. PATENT DOCUMENTS

| | | | |
|---|---|---|---|
| 4,177,084 | 12/1979 | Lau et al. | 148/1.5 |
| 4,178,191 | 12/1979 | Flatly | 148/1.5 |
| 4,358,326 | 11/1982 | Doo | 148/174 |
| 4,385,937 | 5/1983 | Ohmura | 148/1.5 |
| 4,460,417 | 7/1984 | Murase et al. | 148/187 |
| 4,463,492 | 8/1984 | Maeguchi | 29/576 B |
| 4,509,990 | 4/1985 | Vasudev | 148/1.5 |

OTHER PUBLICATIONS

Yoshi et al., Jap. Jour. Appl. Phys. 21 (1981, Suppl. 21-1) 175.
Ohmura et al., J. Appl. Phys. 54 (1983) 6779.
Fang et al., IBM-TDB, 23 (1980) 362.
Baker et al., Jour. Mat. Science 10 (1975) 1259.

*Primary Examiner*—Upendra Roy
*Attorney, Agent, or Firm*—H. Fredrick Hamann; Randall G. Wick; David J. Arthur

[57] ABSTRACT

A silicon on sapphire (SOS) semiconductor structure may be processed to improve the electrical characteristics of a silicon film on a sapphire substrate by silicon-regrowth (SRG) techniques using oxidation to remove silicon from the outward surface of the silicon film. An epitaxial film on a sapphire substrate is implanted with silicon to amorphize the silicon film except for a thin seed layer on the outward surface of the silicon film. The silicon is recrystallized inwards using the seed layer as a seed for crystallization. The silicon film is oxidized to produce an oxide layer on the outward surface of the silicon film, the SOS structure may be heated to densify the oxide layer, and the oxide layer is etched away. This produces a silicon film with a reduced p-type electrical activity and improved crystalline quality surface so that the channel mobility is improved for semiconductor devices fabricated in the silicon film.

12 Claims, 6 Drawing Figures

METHOD OF ELIMINATING P-TYPE ELECTRICAL ACTIVITY AND INCREASING CHANNEL MOBILITY OF SI-IMPLANTED AND RECRYSTALLIZED SOS FILMS

This invention was made with Government support under Contract DAAK20-81-C-0408 awarded by the U.S. Army. The Government has certain rights in this invention.

FIELD OF THE INVENTION

This invention relates generally to the field of microelectronic materials and pertains more particularly to silicon on sapphire fabrication techniques.

BACKGROUND OF THE INVENTION

Silicon on sapphire (SOS) structures in which a thin film of silicon is attached to an insulating sapphire substrate have been made in the past. Microelectronic devices such as transistors, diodes, etc. may be fabricated in the silicon film with the sapphire substrate providing insulation between the devices.

The SOS structures have been fabricated using chemical vapor deposition (CVD) techniques to adhere a crystalline epitaxial film of silicon (Si) onto a sapphire substrate. A problem which has occurred is that the silicon film will contain a high concentration of crystal defects such as stacking faults or twins. The highest concentration of defects occurs at the interface between the sapphire substrate and the silicon film. The lowest concentration of defects occurs at the outward surface of the silicon film, away from the sapphire substrate. The silicon film also experiences a built-in strain produced during the deposition of the silicon film on the sapphire substrate. The presence of defects and strain in the CVD epitaxial SOS is attributed to the 10% mismatch in lattice spacings and the 100% difference in thermal expansion coefficients of Si and sapphire.

Techniques using a surface-regrown (SRG) SOS process have been developed in order to reduce the effects of the defects. The techniques have involved implanting $^{28}$Si ions into the silicon film so as to amorphize all but the surface of the silicon film (i.e., the silicon film is made amorphous except for a thin surface layer which remains crystalline). The range of the implanted silicon atoms is chosen to be approximately equal to the thickness of the silicon film. The amorphized silicon film is then epitaxially recrystallized from the surface inwards, resulting in a reduction in the level of the planar lattice defects near the silicon-sapphire interface. However, the quality of the non-amorphized silicon surface region is not improved by this process. Such techniques result in positive shifts in threshold voltage levels for transistors fabricated in such surface-regrown (SRG) SOS, which are correlated with p-type doping due to aluminum (Al) penetration from the silicon-sapphire interface. This latter effect is believed to be inherent in this SRG SOS process, since it is only observed after both silicon (Si) implantation and recrystallization steps.

SUMMARY OF THE INVENTION

Therefore, it is an object of the invention to produce a silicon film of high crystalline quality on a sapphire substrate.

Another object of the invention is to produce a silicon film of high resistivity, so as to behave electrically as undoped silicon.

A further object of the invention is to provide a method for eliminating the p-type electrical activity of surface-regrown (SRG) silicon on sapphire (SOS) epitaxial films.

Another object of the invention is to provide a method for improving the crystalline quality of the outward surface region of the silicon film of an SOS structure, in order to improve the channel mobility for semiconductor devices fabricated in such films, so that increased operating speeds can be obtained for electrical circuits using such semiconductor devices.

The process of this invention uses surface-regrown (SRG) silicon on sapphire (SOS) techniques and adds further steps to improve the crystalline quality of the silicon film, and to reduce the p-type electrical activity in the silicon film. A sapphire wafer which has been supplied with an epitaxial crystalline silicon film by chemical vapor deposition is implanted with silicon ions in order to amorphize the silicon film excepting for a thin crystalline seed layer at the outward surface of the silicon film. The SOS structure is heated to recrystallize the silicon film using the seed layer as a seed for crystallization so that crystallization proceeds inward from the outward surface of the silicon film towards the silicon-sapphire interface. Next, the silicon film is oxidized to consume the seed layer and produce an oxide layer, the SOS structure may be annealed in order to densify the oxide layer, and the oxide layer is removed by etching. The oxidation of the silicon film is performed at approximately 875° C. in an atmosphere of steam. The annealing of the SOS structure is performed at approximately 875° C. in an atmosphere of flowing nitrogen.

DESCRIPTION OF THE PREFERRED EMBODIMENT

Figure 1:
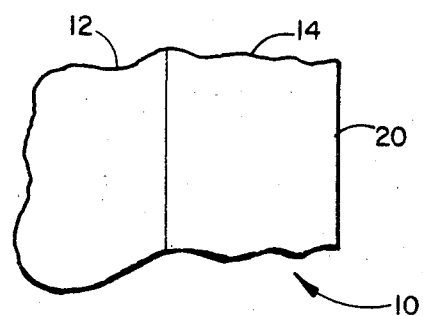
FIG. 1 shows a cross-sectional view of a silicon on sapphire (SOS) structure with an epitaxial crystalline silicon film which has been deposited on a sapphire substrate by chemical vapor deposition.

Referring first to FIG. 1, a silicon on sapphire (SOS) structure 10 is shown in which a sapphire wafer substrate 12 having a chemical composition Al$_2$O$_3$ and crystalline orientation (0112) is provided. An epitaxial crystalline film of silicon 14 having a crystalline orientation (100) is grown on the sapphire substrate 12 using conventional chemical vapor deposition (CVD) techniques. As an illustration, the silicon film 14 may be formed to a thickness of approximately 0.2 micrometers.

Figure 2:
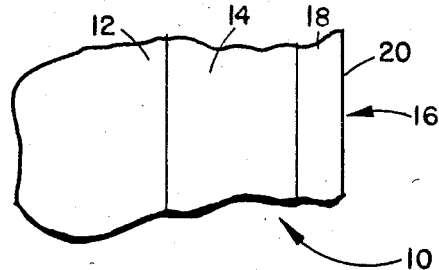
FIG. 2 shows a cross-sectional view of an SOS structure after silicon ion implantation showing a seed layer at the outward surface of the silicon film.

Referring next to FIG. 2, the SOS structure 10 is exposed to ion implantation by injection of $_{28}$Si ion into the silicon film 14 from the direction 16 at an energy of 180 KeV and a dose of $1.4 \times 10^{15}$ Si/cm$^2$. The dosage and energy are set to correspond to the thickness of the silicon film 14, and the levels specified here are set for the film 14 having a thickness of 0.2 micrometers. The purpose of the ion implantation is to amorphize the silicon film 14 except for a thin seed layer 18 at the outward surface 20 of the silicon film 14. In this case, the seed layer 18 has a thickness which is less than approximately 300 Angstroms. After the ion implantation, the seed layer 18 remains crystalline or single crystal and the bulk of the silicon film 14 (other than the seed layer 18) is amorphous or non-crystalline.

Figure 3:
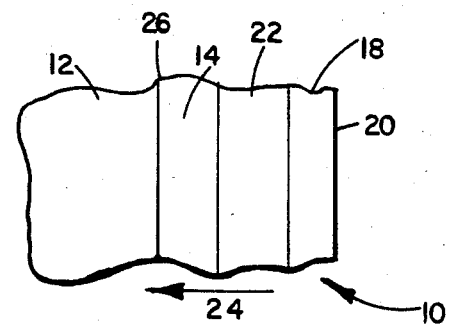
FIG. 3 shows a cross-sectional view of an SOS structure showing the progress of recrystallization of the silicon film inwards from the seed layer.

Referring next to FIG. 3, the recrystallization or solid-phase epitaxial regrowth of silicon is shown in progress. It is preferable that this regrowth be performed by heating the SOS structure 10 to a temperature of approximately 550° C. in an atmosphere of flowing nitrogen. The regrowth proceeds by forming the crystallized region 22 of single crystal silicon inside the silicon film 14. The region 22 forms by using the seed layer 18 as a seed to establish regular crystal patterns. The region 22 grows inwardly from the seed layer 18 and outward surface 20, in the direction of the arrow 24, towards the sapphire-silicon interface 26 which separates the sapphire substrate 12 and silicon film 14.

Figure 4:
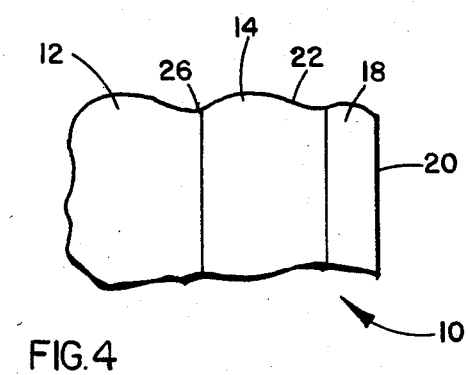
FIG. 4 shows a cross-sectional view of an SOS structure showing the composition of the silicon film after the surface-regrowth (SRG) recrystallization.

Referring next to FIG. 4, the regrowth or recrystallization inside the silicon film 14 is shown as completed. The silicon film 14 at this stage consists of the seed layer 18 at the outward surface 20 and the regrown region 22 which extends from the seed layer 18 to the sapphire-silicon interface 26. The concentration of defects in the region 22 is substantially less than the defect concentration which was present in the silicon film 14 before regrowth, as shown in FIG. 1.

Figure 5:
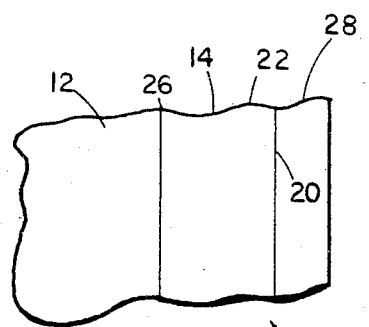
FIG. 5 shows a cross-sectional view of an SOS structure showing the formation of an oxide layer by steam oxidation of the outward surface of the silicon film.

Referring next to FIG. 5, the silicon film 14 is next oxidized by exposure to a steam atmosphere at a temperature of approximately 875° C. in order to produce an oxide layer 28 on the outward surface 20 of the film 14. It is preferable that this use of heat and steam to produce oxidation of the silicon film 14 be continued until the seed layer 18 (see FIG. 4) is consumed by conversion of silicon to silicon dioxide. This oxidation process also allows components of the steam to diffuse into the silicon film 14 and interact with Aluminum in the film 14 which has migrated from the sapphire substrate 12. This interaction results in the migrated Aluminum being rendered electrically inactive thus contributing to a high resistivity for the silicon film 14. The oxide layer 28 will then have a thickness of approximately 0.13 micrometers and the residual thickness of the silicon film 14 will be approximately 0.15 micrometers. After this oxidation step, the silicon film 14 will consist substantially entirely of the regrown region 22, and the silicon of the seed layer 18 (see FIG. 4) will have been converted to silicon dioxide for the oxide layer 28. The steam oxidation is beneficial in both significantly improving the crystal quality, and increasing the resistivity of singly recrystallized SOS films. The SOS structure 10 may next be annealed by heating to a temperature of approximately 875° C. for approximately 30 minutes in an atmosphere of flowing nitrogen in order to densify the oxide layer 28.

Figure 6:
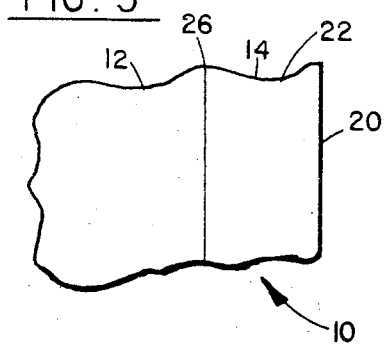
FIG. 6 shows a cross-sectional view of an SOS structure showing the silicon film after the grown oxide layer has been etched away.

Referring next to FIG. 6, the SOS structure 10 is next etched with a 10% solution of hydrofluoric acid (HF) in order to completely etch away and remove the oxide layer 28 (see FIG. 5). At this stage, the silicon film 14 consists substantially entirely of regrown silicon in the region 22 and the outward surface 20 will be regrown silicon produced as described above in connection with FIG. 3. The oxidation (described with reference to FIG. 5) of the non-recrystallized surface layer 18 of the SOS film 14 and the subsequent etching exposes the high quality silicon material in the region 22 underneath the layer 18. At this stage, the SOS structure 10 is ready for the fabrication of semiconductor devices such as transistors or diodes in the silicon film 14, in accordance with conventional device fabrication techniques.

The SOS structure 10 has an advantage in that the seed layer 18 is totally removed as shown in FIG. 6 so that defects produced in film 14 as originally deposited (see FIG. 1) are substantially removed, and the silicon film 14 of FIG. 6 consists substantially of regrown silicon having fewer defects and having an outward surface 20 with better crystalline quality than the surface 20 of FIG. 1. The reduction in the number of defects in the silicon film 14 produces a high electrical resistivity for the film 14, that is, it reduces the p-type electrical activity for the film 14. In practice, the silicon film 14 may be produced with a resistivity above 40 ohm-centimeters using the process of this invention. This means that the silicon film 14 is of high resistivity so as to behave electrically as undoped silicon. Although Aluminum has a tendency to migrate into the silicon film 14 from the sapphire substrate 12 during processing, it is found that the oxidation step used to produce the oxide layer 28 renders this Aluminum electrically inactive in the silicon film 14, thus contributing to the high resistivity of the silicon film 14. The outward surface 20 of FIG. 6, having a better crystalline quality than the surface 20 of FIG. 1, allows improved channel mobility for semiconductor devices fabricated in the silicon film 14, so that increased operating speeds can be obtained for electrical circuits using such semiconductor devices.

Modifications may be made in the process described above in order to produce equivalent devices. For example, alternative methods may be developed for removing the seed layer 18 of FIG. 4. The thickness specifications for the films and layers described herein are given for illustrative purposes, but the technique of this invention is not limited in application to such specific layer and film thicknesses. However, an attempt to apply the process to a silicon film 14 of thickness 0.4 micrometers has not been successful.

What is claimed is:

1. A method for producing a silicon film on a sapphire substrate comprising:
   depositing a thin film of silicon on said sapphire substrate, said silicon film having an outward surface;
   implanting ions into said silicon film to substantially amorphize said silicon film, excepting for a thin seed layer adjacent said outward surface of said silicon film;
   recrystallizing the amorphous portion of said silicon film;
   oxidizing said seed layer for a time sufficient to permit a component of the oxidizing agent to diffuse through said silicon film and react with aluminum in said film to render said aluminum electrically inactive.

2. The method of claim 1 wherein said oxidizing step comprises heating said sapphire substrate and said silicon film to a temperature of approximately 875 degrees Celsius in an atmosphere of steam.

3. The method of claim 1 wherein said thin film of silicon deposited in said depositing step has a thickness of approximately 0.2 micrometers.

4. The method of claim 2 additionally comprising etching away the oxide layer formed in said oxidizing step.

5. The method of claim 3 wherein said oxidizing step is conducted for a length of time substantially equal to the time necessary to form an oxide layer having a thickness of approximately 0.13 micrometers.

6. The method of claim 4, further comprising, prior to said etching step, the step of heating said substrate to a temperature of approximately 875 degrees Celsius in an atmosphere of flowing nitrogen to increase the density of said oxide layer.

7. A method of producing on a sapphire substrate a silicon film of high crystalline quality and increased resistivity comprising:
depositing a thin film of silicon on said sapphire substrate;
transforming a portion of said silicon film adjacent said sapphire substrate into an amorphous silicon layer, leaving a seed layer of deposited crystalline silicon adjacent the outer surface of said silicon layer;
epitaxially recrystallizing said amorphous silicon layer to produce a recrystallized silicon layer; and
oxidizing said seed layer using an oxidizing agent for a time sufficient for a component of said oxidizing agent to react with aluminum distributed through said recrystallized silicon layer to electrically neutralize said aluminum.

8. The method of claim 7 wherein:
said depositing step deposits a silicon film having a thickness of approximately 0.2 microns; and
said oxidizing step is conducted for a length of time substantially equal to the time necessary to oxidize a silicon layer having a thickness of approximately 300 angstroms.

9. The method of claim 7, wherein:
said depositing step deposits a silicon film having a thickness of approximately 0.2 microns; and
said oxidizing step is conducted for a length of time substantially equal to the time necessary to form an oxide layer having a thickness of approximately 0.13 micrometers.

10. The method of claim 7, wherein said oxidizing agent comprises steam, and said oxidizing step is conducted at a temperature of approximately 875 degrees Celsius.

11. The method of claim 7 wherein said recrystallization step comprises heating the sapphire substrate and silicon layer to a temperature of approximately 550 degrees C. in an atmosphere of flowing nitrogen.

12. The method of claim 10 additionally comprising, following said oxdizing step:
heating said sapphire substrate and silicon layer to a temperature of approximately 875 degrees Celsius to increase the density of the oxide layer formed during said oxidizing step; and etching away said oxide layer.

* * * * *